(12) United States Patent
Aso

(10) Patent No.: US 10,998,492 B2
(45) Date of Patent: May 4, 2021

(54) SEMICONDUCTOR DEVICE

(71) Applicant: ABLIC Inc., Chiba (JP)

(72) Inventor: Tatsuya Aso, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/901,511

(22) Filed: Feb. 21, 2018

(65) Prior Publication Data

US 2018/0261761 A1 Sep. 13, 2018

(30) Foreign Application Priority Data

Mar. 9, 2017 (JP) .............................. JP2017-044809

(51) Int. Cl.
*H01L 43/06* (2006.01)
*G01R 33/07* (2006.01)
*H01L 43/04* (2006.01)

(52) U.S. Cl.
CPC .......... *H01L 43/065* (2013.01); *G01R 33/077* (2013.01); *H01L 43/04* (2013.01)

(58) Field of Classification Search
CPC ...... H01L 43/065; H01L 43/04; G01R 33/077
USPC ....................................................... 257/427
See application file for complete search history.

(56) References Cited

U.S. PATENT DOCUMENTS

| | | | | |
|---|---|---|---|---|
| 5,512,541 A * | 4/1996 | Konishi | .................. | C30B 23/02 505/474 |
| 5,679,973 A * | 10/1997 | Mochizuki | .............. | H01L 43/06 257/421 |
| 10,809,318 B2 * | 10/2020 | Lee | .......................... | G01R 33/07 |
| 2006/0097715 A1 * | 5/2006 | Oohira | ................. | G01R 33/066 324/207.2 |
| 2009/0206424 A1 * | 8/2009 | Kilian | .................... | G01R 33/07 257/421 |
| 2010/0164483 A1 * | 7/2010 | Namai | ................... | G01R 33/07 324/207.2 |
| 2010/0252900 A1 * | 10/2010 | Minixhofer | ............ | G01R 33/07 257/421 |

FOREIGN PATENT DOCUMENTS

JP H06-186103 A 7/1994
JP 2006-179594 A 7/2006

* cited by examiner

*Primary Examiner* — Marcos D. Pizarro
*Assistant Examiner* — Sue Tang
(74) *Attorney, Agent, or Firm* — Brinks Gilson & Lione

(57) ABSTRACT

Provided is a Hall element which is reduced in asymmetrically generated offset voltage. A semiconductor device includes: a semiconductor layer of a first conductivity type having a Hall element forming region; an element isolation region of the first conductivity type having a concentration higher than a concentration of the semiconductor layer, the element isolation region being formed so as to surround the Hall element forming region; and a Hall element formed in the Hall element forming region and comprising a magnetism sensing portion of a second conductivity type which is higher in concentration than the semiconductor layer and which is kept apart from the element isolation region through the semiconductor layer.

6 Claims, 3 Drawing Sheets

SEMICONDUCTOR DEVICE

RELATED APPLICATIONS

This application claims priority under 35 U.S.C. § 119 to Japanese Patent Application No. 2017-044809 filed on Mar. 9, 2017, the entire content of which is hereby incorporated by reference.

BACKGROUND OF THE INVENTION

1. Field of the Invention

The present invention relates to a semiconductor device, and more particularly, to a semiconductor device with a Hall element configured to detect a magnetic field in a vertical direction.

2. Description of the Related Art

A Hall element configured to detect a magnetic field in a vertical direction includes, for example, a magnetism sensing portion formed on a semiconductor substrate so as to have a quadrangular shape in plan view and four electrodes provided in the four corners of the magnetism sensing portion.

When a magnetic field is applied in a direction perpendicular to the semiconductor substrate in the thus configured Hall element and a current flows between one of two pairs of opposing electrodes, a Lorentz force is generated in a direction perpendicular to both of the current and the magnetic field by the action of the magnetic field. This generates an electromotive force between the other of the two pairs of opposing electrodes, and the magnetic field can be detected by obtaining the electromotive force as an output voltage.

In an actual Hall element, however, an output voltage is also generated when no magnetic field is applied. The output voltage is called an offset voltage when the magnetic field is 0. The offset voltage needs to be removed when the Hall element is used as a magnetic sensor.

A method of removing the offset voltage by spinning current method (offset cancellation) has been proposed (see Japanese Patent Application Laid-open No. H06-186103, for example).

For example, in the Hall element described above, this spinning current method is performed by measuring an output voltage generated between one pair of opposing electrodes by the current flow between the other pair of opposing electrodes, measuring an output voltage generated between the other pair of opposing electrodes by the current flow between the one pair of opposing electrodes, and subtracting the output voltages. Thus, the offset voltage is canceled out.

Offset cancellation by spinning current is capable of cancelling out an offset voltage generated symmetrically in a Hall element, however cannot cancel out an asymmetrically generated offset voltage, which remains unremoved.

Possible causes of the asymmetrically generated offset voltage are, for example, mechanical stress applied to the element from the outside, misalignment in the process of manufacturing, and uneven potential distribution inside the element affected by a depletion layer due to element isolation.

SUMMARY OF THE INVENTION

It is an object of the present invention to provide a semiconductor device with a Hall element which is reduced in asymmetrically generated offset voltage.

In one embodiment of the present invention, there is provided a semiconductor device including: a semiconductor layer of a first conductivity type having a Hall element forming region; an element isolation region of the first conductivity type having a concentration higher than a concentration of the semiconductor layer, the element isolation region being formed so as to surround the Hall element forming region; and a Hall element formed in the Hall element forming region and comprising a magnetism sensing portion of a second conductivity type which is higher in concentration than the semiconductor layer and which is kept apart from the element isolation region through the semiconductor layer.

According to the present invention, the magnetism sensing portion of the second conductivity type is not in direct contact with the element isolation region of the first conductivity type and is in contact with the semiconductor layer of the first conductivity type interposed between the magnetism sensing portion and the element isolation region. The semiconductor layer is lower in concentration than the magnetism sensing portion. Accordingly, the width of a depletion layer spreading inside the magnetism sensing portion can accordingly be kept narrow. This prevents the depletion layer from affecting the Hall element and causing uneven potential distribution inside the Hall element. An asymmetrically generated offset voltage can consequently be reduced.

BRIEF DESCRIPTION OF THE DRAWINGS

Embodiments of the invention will now be described, by way of example, with reference to the accompanying drawings, in which.

DETAILED DESCRIPTION OF THE EMBODIMENTS

The invention will be now described herein with reference to illustrative embodiments.

Figure 1A:
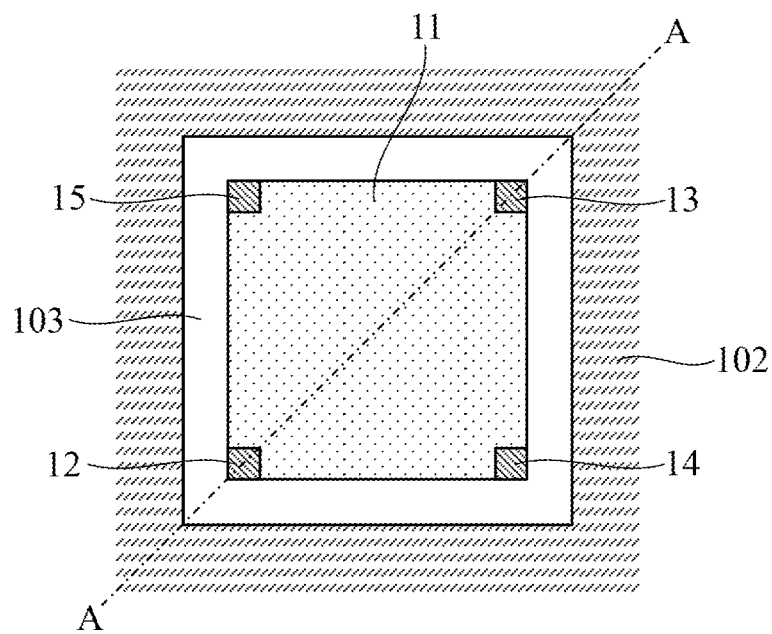
FIG. 1A is a plan view of a semiconductor device with a Hall element according to an embodiment of the present invention.
Figure 1B:
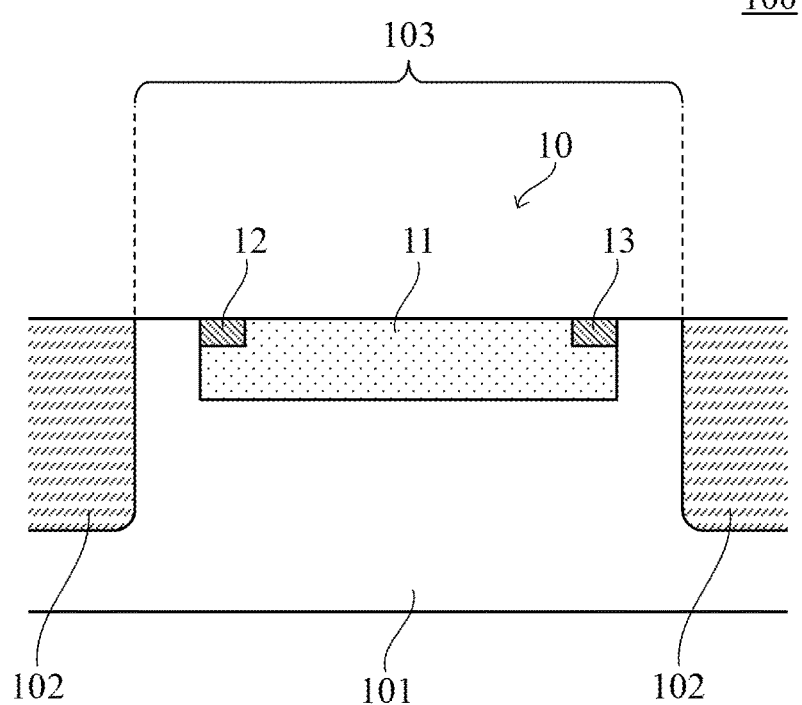
FIG. 1B is a sectional view taken along the line A-A of FIG. 1A.

FIG. 1A is a plan view for illustrating a semiconductor device 100 with a Hall element according to an embodiment of the present invention, and FIG. 1B is a sectional view taken along the line A-A of FIG. 1A.

As illustrated in FIG. 1A and FIG. 1B, the semiconductor device 100 according to this embodiment includes an element isolation region 102 of a P type (first conductivity type) formed in a semiconductor substrate (also referred to as "semiconductor layer") 101 of the P type and a Hall element 10 provided in a Hall element forming region 103. The element isolation region 102 is higher in concentration than the semiconductor substrate 101. The Hall element forming region 103 is defined by the element isolation region 102.

The Hall element 10 includes a magnetism sensing portion 11 of an N type (second conductivity type) which is higher in concentration than the semiconductor substrate 101 and which is kept apart from the element isolation region 102 through the semiconductor substrate 101, and N-type electrodes 12 to 15 which are formed on a surface of the magnetism sensing portion 11 and which are higher in concentration than the magnetism sensing portion 11. The magnetism sensing portion 11 has a square shape in plan view as illustrated in FIG. 1A.

The electrodes 12 to 15 are arranged so as to fits to the four corners of the square-shaped magnetism sensing portion 11, respectively. For example, when the electrodes 12 and 13 function as control current supply electrodes, the electrodes 14 and 15 function as Hall voltage output electrodes.

The element isolation region 102 is connected to a reference potential by an electrode (not shown) provided on a surface of the element isolation region 102.

To operate the Hall element 10, a potential difference is applied between the electrodes 12 and 13 as control current supply electrodes so that a current flows from the electrode 12 to the electrode 13 (or from the electrode 13 to the electrode 12).

When the current is flowing between the electrodes 12 and 13, a depletion layer extending toward the magnetism sensing portion 11 can be kept small because the impurity concentration is lower in the P-type semiconductor substrate 101 than in the N-type magnetism sensing portion 11. This reduces the adverse effect of the depletion layer on the interior of the Hall element 10, thereby preventing uneven potential distribution inside the Hall element 10. An asymmetrically generated offset voltage can accordingly be reduced.

The low concentration of the semiconductor substrate 101 tends to allow a leak current to be large in a PN junction between the P-type semiconductor substrate 101 and the N-type magnetism sensing portion 11. It is therefore preferred to place the element isolation region 102 which is higher in concentration than the P-type semiconductor substrate 101 close to the magnetism sensing portion 11 enough to reduce the leak current.

If the element isolation region 102 and the magnetism sensing portion 11 are too close and in direct contact with each other, however, the element isolation region 102 of the high concentration allows the depletion layer to extend large into the magnetism sensing portion 11, although a leak current from the magnetism sensing portion 11 can be reduced.

The extension of the depletion layer into the magnetism sensing portion 11 in this case can be reduced by setting the concentration of the magnetism sensing portion 11 as high as the concentration of the element isolation region 102. However, the concentration of the magnetism sensing portion 11 needs to be low within a practical range in order to enhance the sensitivity of the Hall element, which is determined by the mobility of the magnetism sensing portion 11.

It is therefore desirable to, as described above, place the element isolation region 102 close to the magnetism sensing portion 11 enough to reduce the leak current from the magnetism sensing portion 11 and interpose a part of the semiconductor substrate 101 between the element isolation region 102 and the magnetism sensing portion 11 so that the interposed part is wide enough to keep the extension of the depletion layer into the magnetism sensing portion 11 satisfactorily small.

Modification Example 1

Figure 2A:
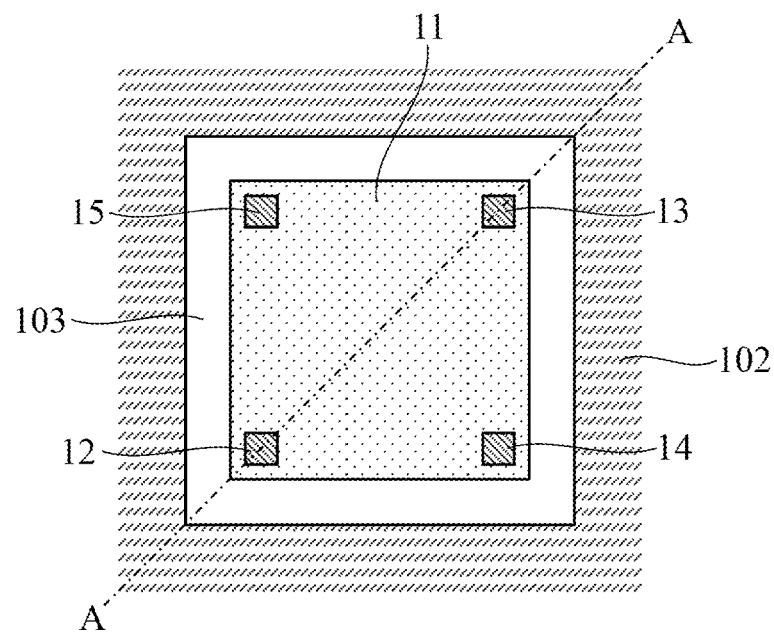
FIG. 2A is a plan view for illustrating a modification example of the semiconductor device with a Hall element according to the embodiment of the present invention.
Figure 2B:
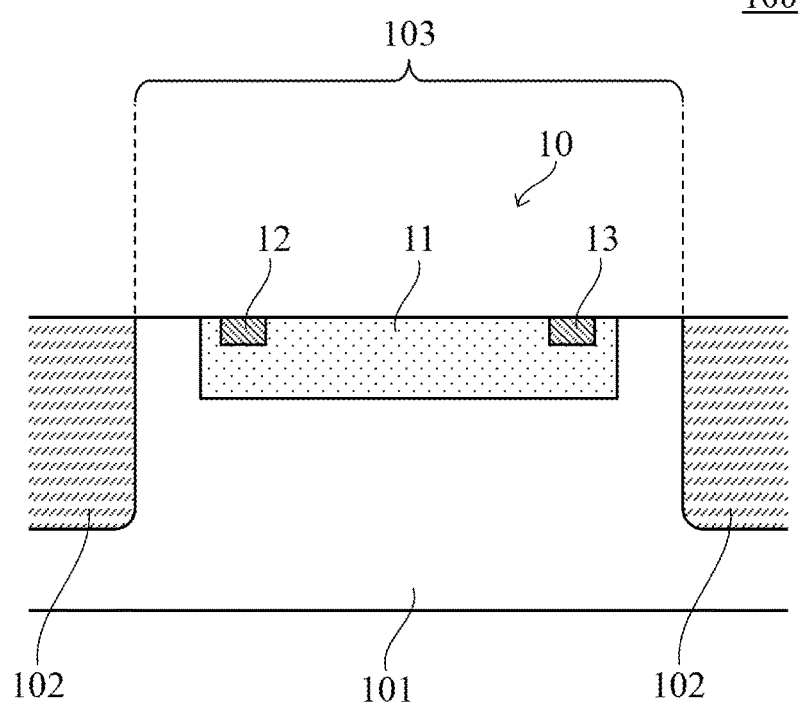
FIG. 2B is a sectional view taken along the line A-A of FIG. 2A.

FIG. 2A is a plan view for illustrating a modification example of the semiconductor device 100 with a Hall element according to the embodiment of the present invention, and FIG. 2B is a sectional view taken along the line A-A of FIG. 2A.

In FIG. 1A and FIG. 1B, the electrodes 12 to 15 are arranged in the four corners of the square-shaped magnetism sensing portion 11 so as to be contact edge portions of the magnetism sensing portion 11. The electrodes 12 to 15 in Modification Example 1, on the other hand, are respectively arranged at a predetermined distance from the edge portions of the magnetism sensing portion 11.

This configuration prevents the depletion layer which extends slightly into the N-type magnetism sensing portion 11 due to a junction with the P-type semiconductor substrate 101, from reaching the electrodes 12 to 15. Uneven potential distribution inside the Hall element 10, particularly in an inner region past the electrodes 12 to 15, is thus prevented. An even more reduction in asymmetrically generated offset voltage can therefore be expected.

Modification Example 2

Figure 3:
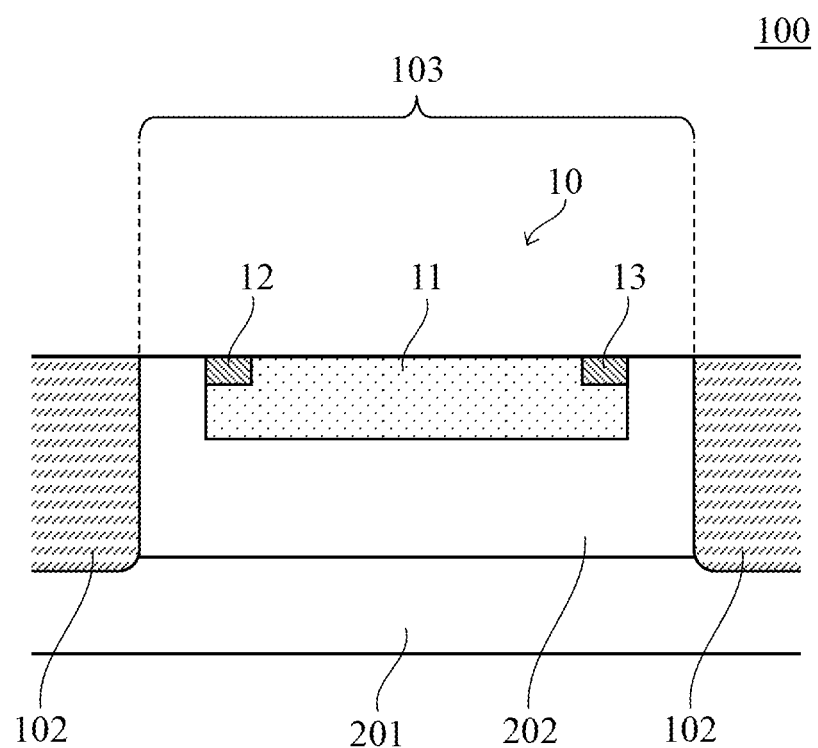
FIG. 3 is a sectional view for illustrating another modification example of the semiconductor device with a Hall element according to the embodiment of the present invention.

FIG. 3 is a sectional view for illustrating another modification example of the semiconductor device 100 with a Hall element according to the embodiment of the present invention. The plan view of the semiconductor device 100 in Modification Example 2 is the same as FIG. 1A, and is therefore omitted from FIG. 3.

In Modification Example 2, the semiconductor substrate 101 in FIG. 1A and FIG. 1B is replaced by a semiconductor layer interposed between the element isolation region 102 and the magnetism sensing portion 11, and a P-type semiconductor layer 202 which is formed from an epitaxial layer formed on a P-type semiconductor substrate 201 serves as the interposed semiconductor layer.

This configuration can also provide the same effects as those of the semiconductor device 100 with the Hall element 10 configured as illustrated in FIG. 1A and FIG. 1B.

An N-type semiconductor substrate may also be used as the semiconductor substrate 201 in Modification Example 2.

It is apparent that the present invention is not limited to the above embodiments, but may be modified and changed without departing from the scope and spirit of the invention.

For example, the first conductivity type as the P type and the second conductivity type as the N type in the embodiments described above may be switched to set the first conductivity as the N type and the second conductivity as the P type.

What is claimed is:

1. A semiconductor device, comprising:
   a semiconductor layer of a first conductivity type having a Hall element region therein;
   an element isolation region having an impurity concentration of the first conductivity type that is higher than an impurity concentration of the first conductivity type of the semiconductor layer, the element isolation region surrounding the Hall element region; and
   a Hall element in the Hall element region and comprising a magnetism sensing portion having an impurity concentration of a second conductivity type that is higher than the impurity concentration of the first conductivity type of the semiconductor layer and spaced apart from the element isolation region by the semiconductor layer, wherein the element isolation region is in contact with the semiconductor layer and has a greater depth in the semiconductor layer than that of the magnetism sensing portion.

2. The semiconductor device according to claim 1, further comprising electrodes having an impurity concentration of the second conductivity type that higher than the impurity concentration of the second conductivity type of the magnetism sensing portion and on a surface of the magnetism sensing portion, the electrodes at a predetermined distance from edge portions of the magnetism sensing portion.

3. The semiconductor device according to claim 2, wherein the semiconductor layer comprises an epitaxial layer.

4. The semiconductor device according to claim 1, wherein the semiconductor layer comprises a semiconductor substrate.

5. The semiconductor device according to claim 2, wherein the semiconductor layer comprises a semiconductor substrate.

6. The semiconductor device according to claim 1, wherein the semiconductor layer comprises an epitaxial layer.

* * * * *